United States Patent [19]
Shirasaki

[11] Patent Number: 5,373,625
[45] Date of Patent: Dec. 20, 1994

[54] METHOD FOR MAKING THERMAL HEADS

[75] Inventor: Toshiyuki Shirasaki, Kyoto, Japan

[73] Assignee: Rohm Co., Ltd., Kyoto, Japan

[21] Appl. No.: 775,344

[22] Filed: Oct. 15, 1991

[51] Int. Cl.$^5$ .............................................. H05B 3/00
[52] U.S. Cl. ...................................... 29/611; 29/846; 29/412
[58] Field of Search ................. 29/611, 846, 412, 413, 29/417

[56] References Cited

U.S. PATENT DOCUMENTS 4,385,083  5/1983  Shelley ................................ 118/500
4,417,257 11/1983  Mitsui ............................ 346/76 PH
4,711,019 12/1987  Albeck et al. ......................... 29/415

FOREIGN PATENT DOCUMENTS 61-111172  7/1986  Japan.

Primary Examiner—P. W. Echols
Attorney, Agent, or Firm—William H. Eilberg

[57] ABSTRACT

A plurality of thermal heads are made from a rectangular material substrate board having one surface entirely formed with a conductor layer which has bulging portions extending along and adjacent to the four sides of the material substrate board. First, the conductor layer is etched in different regions of the substrate board so that each region is made to have a conductor pattern for a corresponding thermal head, wherein the conductor pattern at least in one region of the substrate board is made to have a common electrode provided by one bulging portion of the conductor layer. Then, the different regions of the substrate board are separated from each other to provide different thermal heads.

5 Claims, 3 Drawing Sheets

METHOD FOR MAKING THERMAL HEADS

BACKGROUND OF THE INVENTION

1. Field of the Invention

This invention relates to a method for making thermal heads. More particularly, the present invention relates to a method for making a plurality of thermal heads from a material substrate board.

2. Description of the Prior Art

As is well known, thermal heads are widely used in facsimile machines to print transmitted information on thermosensitive paper. The thermal head is also used in printers of the type wherein the ink of a transfer ink ribbon or film is thermally caused to be transferred onto printing paper.

There are various types of thermal heads which include line-type heads and matrix-type heads. The line-type thermal head has a row (line) of multiple heating dots, as disclosed for example in Japanese Patent Application Laid-open No. 63-221055. The matrix-type thermal head has a multiplicity of heating dots arranged in a matrix, as disclosed for example in U.S. Pat. No. 3,855,448 to Hanagata et al.

The present invention is applicable to both types of thermal heads as long as the head incorporates a substrate which carries a common electrode along and adjacent to a marginal edge of the substrate. FIG. 1 of the accompanying drawings illustrates a typical line-type thermal head to which the present invention is advantageously applied.

As shown in FIG. 1, the typical line-type thermal head comprises an elongate insulating substrate 1 having a length L and a width S. The substrate 1 has one surface formed with a conductor pattern which includes a common electrode 31 extending along and adjacent to one longitudinal edge, individual electrodes 32 and other circuit parts (not shown). The common electrode 31 has a pair of side portions 31a extending along the two shorter edges of the substrate. The substrate further carries a heating resistor line 4 electrically connected to the common electrode 31 and the individual electrodes 32, and an array of drive IC's 5 connected to the individual electrodes 32. The drive IC's cause divisional heating of the resistor line to provide a line of heating dots.

In manufacturing such a thermal head, use is made of a rectangular material substrate board 2, as shown in FIGS. 5 and 6. Specifically, the substrate board 2 has a size enough to provide a plurality of substrates, and is formed with a conductor layer 3. The conductor layer 3 has bulging portions 3a of a width S1 along the four sides 2a-2d of the substrate board 2 because a conductor paste (which is subsequently dried and cured) for the layer 3 has a tendency of bulging at edged positions due to the surface tension of the paste.

Obviously, the bulging portions 3a of the conductor layer 3 are not suitable for etching a sophisticated circuit portion because insufficient conductor removal tends to occur at the thicker bulging portions 3a. This problem becomes more remarkable when the substrate board 2 has a glazing layer (not shown) which itself has a tendency of bulging at the four sides of the substrate board.

Therefore, in a prior art method for making thermal heads from such a substrate board 2, the conductor layer 3 is etched to provide conductor patterns only in regions (e.g. three regions for providing three thermal heads A) which are located clear of the bulging portions 3a, as shown in FIG. 7. Thus, the bulging portions 3a at the four sides are left blank and later removed away at the time of separating the thermal heads A by cutting or cracking (cracking along a scribed line or pre-formed groove).

The prior art method described above is disadvantageous in the following respects.

First, the substrate board 2 must have an overall width So which is at least equal to a multiple of the individual substrate width S plus double the width S1 of the bulging portions 3a, and all of the bulging portions must be later removed for separating the thermal heads A. Thus, waste of material is unavoidable according to the prior art method.

Secondly, an operation of removing the bulging portions 3a by cutting or cracking is required in addition to separating the thermal heads A from each other. Combined with the material waste, such an additional operation increases the production cost. Further, the additional cutting or cracking increases the possibility of damaging the intricate conductor pattern of each thermal head, thus decreasing the yield.

SUMMARY OF THE INVENTION

It is, therefore, an object of the present invention to provide a method for making thermal heads which is capable of eliminating or reducing the disadvantages of the prior art method.

According to the present invention, there is provided a method for making thermal heads, each thermal head comprising a substrate having one surface formed with a conductor pattern and a heat generating means, the conductor pattern including a common electrode extending along and adjacent to one marginal edge of the substrate, the method comprising the steps of: preparing a material substrate board having one surface entirely formed with a conductor layer, the conductor layer having bulging portions extending along and adjacent to marginal edges of the material substrate board; etching the conductor layer in different regions of the substrate board so that each region is made to have the conductor pattern for the each thermal head; and separating the different regions of the substrate board from each other; wherein at least one bulging portion of the conductor layer is made to provide a common electrode in one region of the substrate board.

The common electrode has the sole function of distributing current to various portions of the heat generating means (resistor). Thus, the common electrode can be made to have a relatively large width, and the current distributing function is not adversely affected even if the common electrode is relatively thick. The present invention, which is based on this finding, positively utilizes a bulging portion of the conductor layer to form a common electrode at least in one region of the substrate board, thereby reducing material waste.

Further, according to the method of the present invention, the bulging portion of the conductor layer which forms a common electrode need not be removed by cutting or cracking. As a result, the manufacturing process may be facilitated, and the yield is increased.

Normally, each substrate is elongate, and the material substrate board is rectangular. In this case, the common electrode of the substrate extends along and adjacent to a longitudinal edge of the substrate. Further, the different regions of the substrate board are arranged side-byside in a manner such that said one region of the substrate board is located adjacent to one side of the substrate board, whereas another region of the substrate board is located adjacent to an opposite side of the substrate board.

Preferably, another bulging portion of the conductor layer extending along and adjacent to said opposite side of the substrate board is also made to provide a common electrode in said another region of the substrate board. This arrangement is advantageous in further reducing material waste with respect to the substrate board.

Other objects, features and advantages of the present invention will be clearly understood from the following description of the preferred embodiments given with reference to the accompanying drawings.

DETAILED DESCRIPTION OF THE PREFERRED EMBODIMENTS

Figure 1:
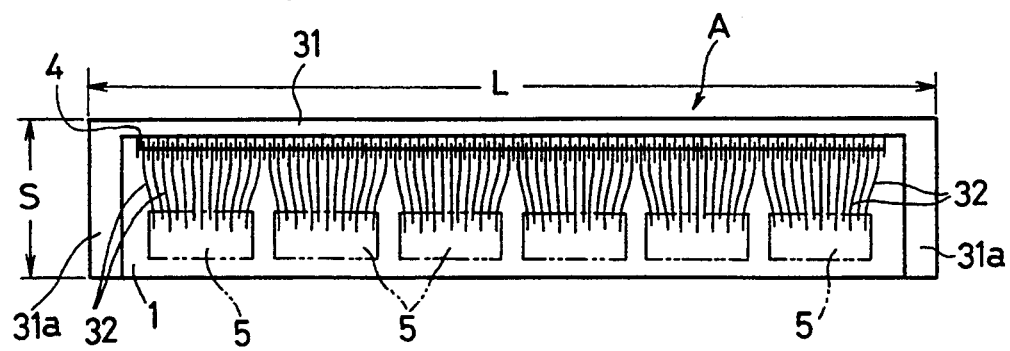
FIG. 1 is a plan view showing a thermal head which can be advantageously made by the method of the present invention.

Throughout the accompanying drawings, like parts are designated by the same reference numerals and characters.

Figure 7:
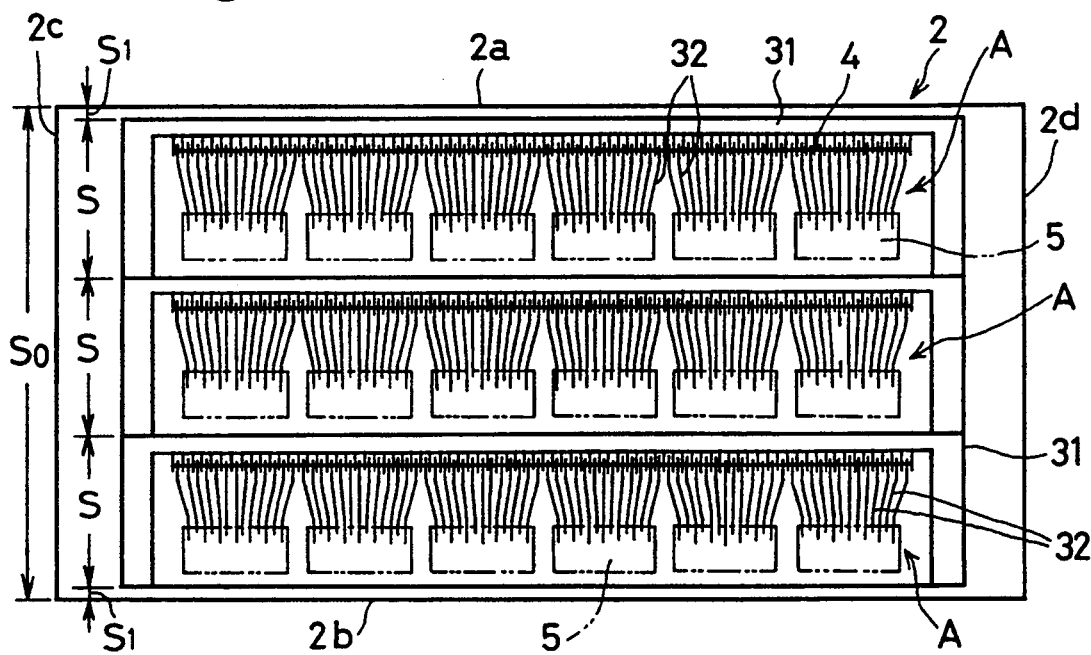
FIG. 7 is a plan view showing a prior art method for making thermal heads.

Similarly to the prior art method shown in FIG. 7, the method according to the present invention is advantageously used to manufacture thermal heads of the type shown in FIG. 1. Specifically, the thermal head A comprises an elongate insulating substrate 1 having a length L and a width S. The substrate 1 has one surface formed with a conductor pattern which includes a common electrode 31 extending along and adjacent to one longitudinal edge, individual electrodes 32 and other circuit parts (not shown). The common electrode 31 has a pair of side portions 31a extending along the two shorter edges of the substrate. The substrate further carries a heating resistor line 4 electrically connected to the common electrode 31 and the individual electrodes 32, and an array of drive IC's 5 connected to the individual electrodes 32.

Figure 5:
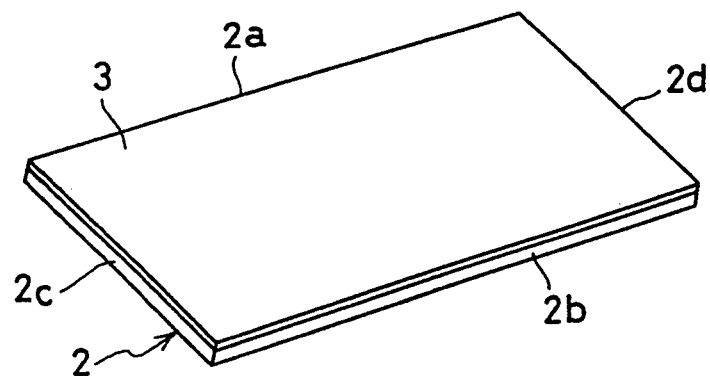
FIG. 5 is a perspective view showing a material substrate board which is used in carrying out the inventive method.
Figure 6:
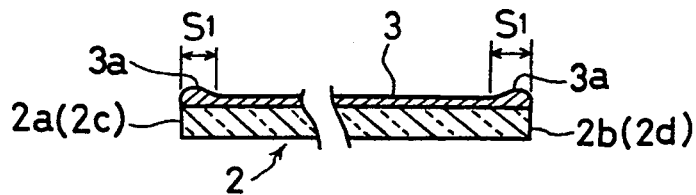
FIG. 6 is a sectional view of the material substrate board.

A plurality of such thermal heads may be made simultaneously from a rectangular material substrate board 2, as shown in FIGS. 5 and 6. One surface of the substrate board 2 is entirely formed with a conductor layer 3 which has bulging portions 3a of a width S1 extending along the four sides 2a–2d of the substrate board 2.

Figure 2:
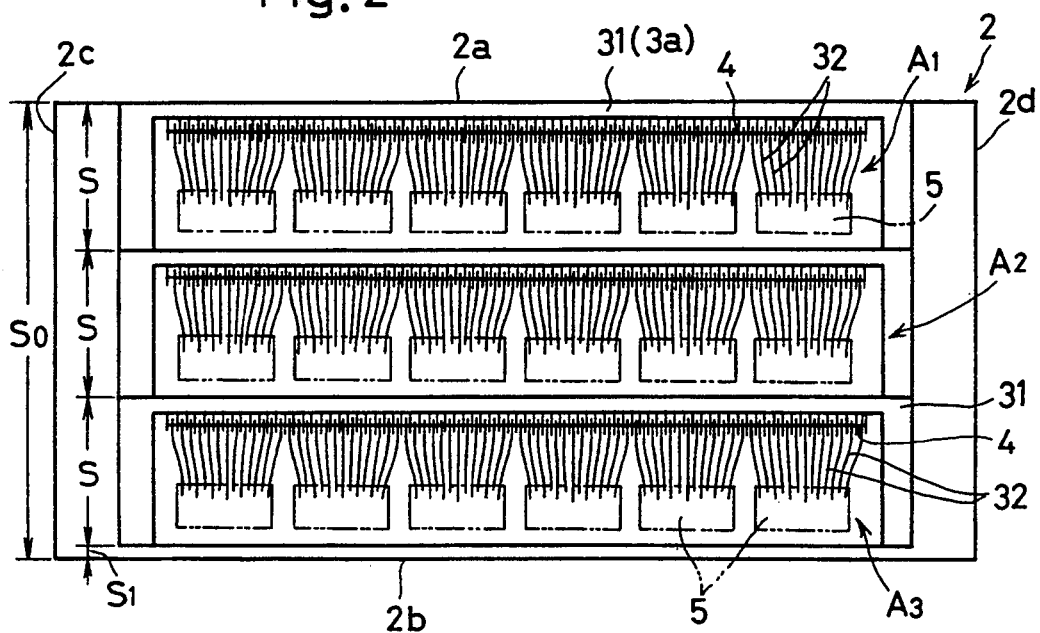
FIG. 2 is a plan view showing a first embodiment of the inventive method.

FIG. 2 shows a method according to a first embodiment of the present invention for making three thermal heads A1–A3 (first to third thermal heads) from the material substrate board 2. First, the conductor layer 3 of the material substrate board 2 is etched in three different regions to provide respective conductor patterns for the three thermal heads A1–A3. In the embodiment of FIG. 2, the respective conductor patterns are oriented identically, so that the respective common electrodes 31 of the three thermal heads A1–A3 are located closer to one longer side 2a of the substrate board. Further, the common electrode 31 for the first thermal head A1 is formed of a bulging portion 3a of the conductor layer 3 (see FIG. 6) extending at the one longer side 2a of the substrate board. The respective thermal heads A1–A3 are subsequently separated from each other by cutting or cracking.

In the method described above, formation of the heating resistors 4 and mounting of drive IC's may be performed either before or after the respective thermal heads A1–A3 are separated from each other.

According to the embodiment of FIG. 2, the bulging portion 3a at the one longer side 2a of the material substrate board 2 is positively utilized to form the common electrode 31 of the first thermal head A1. Therefore, the overall width So of the substrate board 2 can be made smaller by an amount S1 (corresponding to the width of the bulging portion) than conventionally required. Further, the substrate board 2 need not be cut or cracked along and adjacent to the one longer side 2a at the time of separating the respective thermal heads A1–A3. Thus, the overall manufacturing process can be facilitated with less likelihood of reducing the yield.

Figure 3:
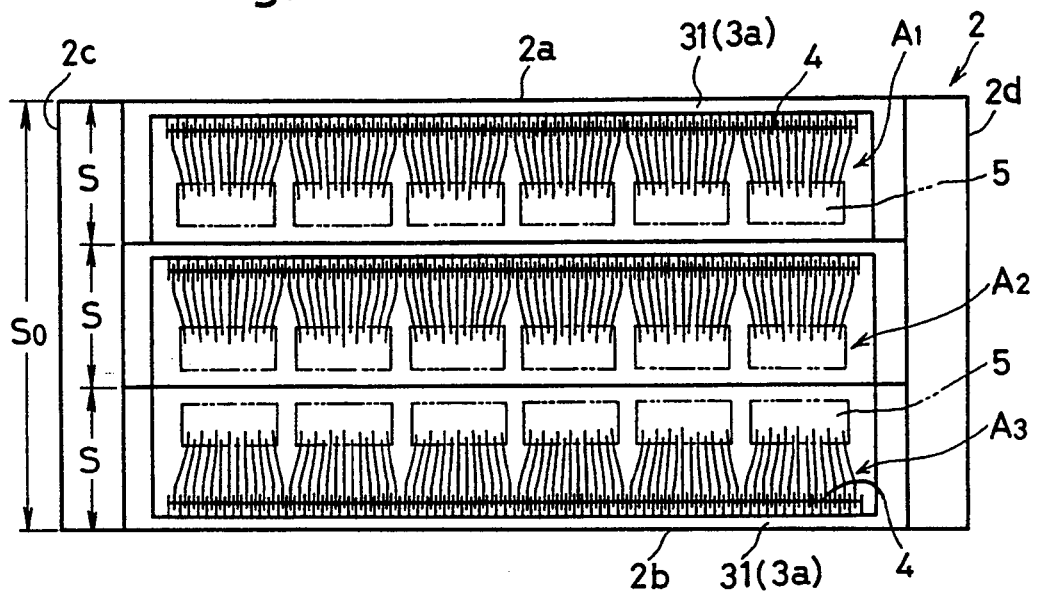
FIG. 3 is a plan view showing a second embodiment of the inventive method.

FIG. 3 shows a method according to a second embodiment of the present invention which is an improvement over the embodiment of FIG. 2.

As shown in FIG. 3, the respective conductor patterns for the first and second thermal heads A1, A2 are formed in identical orientation, so that their respective common electrodes 31 are located closer to one longer side 2a of the material substrate board 2. Thus, the common electrode 31 for the first thermal head A1 is provided by a bulging portion 3a located at the one longer side 2a. On the other hand, the conductor pattern for the third thermal head A3 is oppositely oriented, so that its common electrode 31 is provided by another bulging portion 3a located at the other longer side 2b of the substrate board.

According to the second embodiment, the two bulging portions 3a extending at the two longer sides 2a, 2b of the material substrate board 2 are positively used for forming the respective common electrodes for the first and third thermal heads A1, A3. Thus, the overall width So of the material substrate board 2 can be rendered smaller by an amount of 2×S1 (corresponding to double the width of the bulging portion) than conventionally required. Further, the substrate board 2 need not be cut or cracked along and adjacent to the two longer sides 2a, 2b at the time of separating the respective thermal heads A1–A3. Thus, the overall manufacturing process can be additionally facilitated with even less likelihood of reducing the yield.

Figure 4:
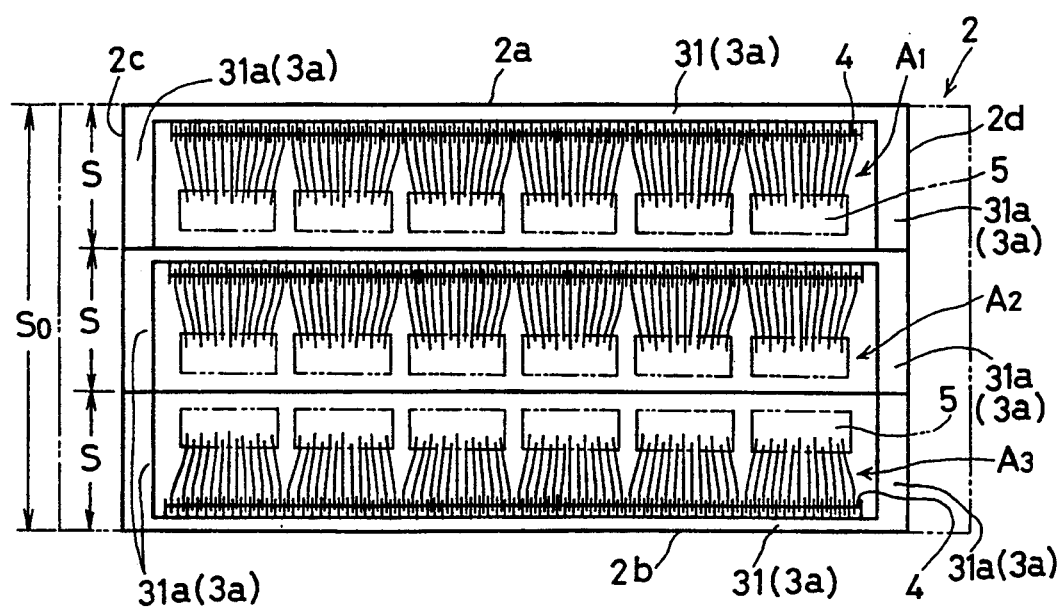
FIG. 4 is a plan view showing a third embodiment of the inventive method.

FIG. 4 shows a method according to a third embodiment of the present invention which is a slight modification from the embodiment of FIG. 3.

As shown in FIG. 4, the material substrate board 2 has a length corresponding to the length L of the substrates 1 (see FIG. 1) which are subsequently separated from the substrate board. As a result, the bulging portions 3a extending at the two shorter sides 2c, 2d are utilized to provide the side portions 31a of the common electrodes 31 of the respective thermal heads A1–A3. The embodiment of FIG. 4 is otherwise the same as that of FIG. 3.

According to the third embodiment, all of the four bulging portions 3a extending at the four sides 2a-2d of the material substrate board 2 are positively used for entirely or partially forming the respective common electrodes 31 (including the side portions 31a) for the first to third thermal heads A1-A3. Thus, not only the overall width So of the material substrate board 2 but also the length of the substrate board can be rendered smaller than conventionally required. Further, the substrate board 2 need not be cut or cracked along and adjacent to the four sides 2a-2d at the time of separating the respective thermal heads A1-A3. Thus, the overall manufacturing process can be additionally facilitated with even less likelihood of reducing the yield.

The present invention being thus described, it is obvious that the same may be varied in many ways. Such variations are not to be regarded as a departure from the spirit and scope of the invention, and all such modifications as would be obvious to those skilled in the art are intended to be included within the scope of the following claims.

I claim:

1. A method for making thermal heads, each thermal head comprising a substrate having one surface formed with a conductor pattern and a heat generating means, said conductor pattern including a common electrode extending along and adjacent to one marginal edge of said substrate, the method comprising the steps of:

preparing a material substrate board having one surface entirely formed with a conductor layer, said conductor layer having bulging portions extending along and adjacent to marginal edges of said material substrate board;

etching said conductor layer in different regions of said substrate board, other than in said bulging portions, so that each region is made to have said conductor pattern for said each thermal head; and separating said different regions of said substrate board from each other;

wherein at least one bulging portion of said conductor layer is made to provide a common electrode at least in one region of said substrate board.

2. The method according to claim 1, wherein said each substrate is elongate, said common electrode of said each substrate extending along and adjacent to a longitudinal edge of said substrate.

3. The method according to claim 2, wherein said material substrate board is rectangular, said different regions of said substrate board are arranged side-by-side in a manner such that said one region of said substrate board is located adjacent to one side of said substrate board, whereas another region of said substrate board is located adjacent to an opposite side of said substrate board.

4. The method according to claim 3, wherein another bulging portion of said conductor layer extending along and adjacent to said opposite side of said substrate board is also made to provide a common electrode in said another region of said substrate board.

5. The method according to claim 3, wherein said common electrode of said each substrate has a pair of side portions extending along shorter marginal edges of said each substrate, at least one side portion of said common electrode being provided by another bulging portion of said conductor layer extending along and adjacent to another side of said substrate board which is perpendicular to said one side of said substrate board.

* * * * *